United States Patent [19]
Kuchta

[11] Patent Number: 6,013,537
[45] Date of Patent: Jan. 11, 2000

[54] METHOD OF SEMICONDUCTOR WAFER TESTING

[75] Inventor: Daniel M. Kuchta, Cortlandt Manor, N.Y.

[73] Assignee: International Business Machines Corporation, Armonk, N.Y.

[21] Appl. No.: 09/037,465

[22] Filed: Mar. 10, 1998

Related U.S. Application Data

[62] Division of application No. 08/588,467, Jan. 16, 1996, Pat. No. 5,757,027
[60] Provisional application No. 60/007,274, Nov. 6, 1995.

[51] Int. Cl.[7] .............................. H01L 21/02; H01L 21/66
[52] U.S. Cl. ................................................. 438/18; 438/23
[58] Field of Search ................................... 438/5, 10, 11, 438/14, 17, 18, 22, 23, 193, 238, 329; 257/48, 81; 372/38, 45, 50

[56] References Cited

U.S. PATENT DOCUMENTS 5,317,587   5/1994   Ackley et al. .

*Primary Examiner*—Charles Bowers
*Assistant Examiner*—Keith Christianson
*Attorney, Agent, or Firm*—Louis P. Herzberg

[57] ABSTRACT

The present invention is a structure and method to reduce the inductance of the AC test signal path used for testing an electrical device contained within a semiconductor wafer. This extends the frequency range of testing. It enables testing the devices perform characteristics at higher frequencies than otherwise useable. It is particularly directed for testing on-wafer VCSELs. The method provides to the electrical device the characteristics of a microwave bias-tee device. An on wafer capacitor is designed into the environment of the electrical device enabling the formation and use of the three ports of a bias-tee. Preferably, the bias-tee is formed in a manner not requiring the addition of processing steps to the wafer manufacturing process. The method further provides a way to increase the capacitance of the on-wafer capacitor.

4 Claims, 6 Drawing Sheets

METHOD OF SEMICONDUCTOR WAFER TESTING

This is a division of application Ser. No. 08/588,467, filed Jan. 16, 1996 U.S. Pat. No. 5,757,027. Priority of application Ser. No. 60/007,274, filed on Nov. 6, 1995 in U.S. is claimed under 35 U.S.C. 119(e).

FIELD OF THE INVENTION

The present invention is directed to the field of electrical device testing at the wafer level. It is particularly directed to laser testing at the wafer level, and more particularly to high frequency testing of Vertical Cavity Surface Emitting Lasers (VCSELs).

BACKGROUND OF THE INVENTION

The term electrical device as used herein includes devices having electrical inputs and/or outputs, devices having optical inputs and/or outputs, and devices having electro-optical inputs and/or outputs. Thus, although the description is directed to VCSELs the inventive concept is meant to be used with any electrical device.

Performance testing of semiconductor lasers is important during the wafer manufacturing phase in order to ascertain the lasers operability and its meeting particular specifications. It is advantageous to be able to validate the performance as early as possible so as to remove faulty wafers from further processing. A VCSEL semiconductor laser permits a first level of testing at the wafer level. VCSEL technology is described in a paper entitled "Progress in Planarized Vertical Cavity Surface Emitting Laser Devices and Arrays," by Morgan et al., SPIE, Vol. 1562, pp. 149–159, 1991, which is incorporated herein by reference.

A prime using candidate of VCSEL diode technology is data communication. In data communications, as in some other technologies, the high frequency characteristics of the diode laser are extremely important. The characteristics include rise and fall times, bandwidth, relaxation oscillation frequency, and small and large signal response. The wafer level testing techniques employed to date are not usable at high frequencies due to the long return path that the laser current has to travel. The severity of this problem is illustrated in FIG. 1. FIG. 1 shows a typical closed test loop for testing the performance of a laser on a wafer. The wafer diameter is typically three to four inches. It is noted that the maximum test frequency is inversely proportional to the physical length of the electrical circuit's wire return path. A long return path reduces the maximum test frequency. The return path starts at the point the wafer test probe 80 makes contact with the top diode contact 10, usually the anode. The laser diode 15 is located along the wafer cross section 25. The return path continues through the diode's active region 20, and out through the substrate 30. The substrate 30 is generally in contact with a chuck or wafer holder 40 which acts as a common ground contact. The loop is closed with a wire 50 connected to the test signal source 60 and returns through a second wire 70 attached to the probe 80. The test current must travel several inches through the electrical circuit's test loop. The long electrical wire represents a significant high impedance inductance that severely limits high frequency testing with the probe 80. The present invention is a method and apparatus to enable high frequency testing and overcome this limitation.

SUMMARY OF THE INVENTION

It is an object of this invention to provide a structure and method for testing an electrical device contained within a wafer. It is particularly directed where the structure is a bias-tee, and more particularly directed where the electrical device is a VCSEL.

It is a particular object of the present invention to provide a structure comprising a wafer having an electrical device contained within itself. The electrical device has a top layer stack which provides a connection for an AC/DC bias-fee electrode, an active region, and a bottom layer stack which provides a connection for a DC-only bias-tee electrode. A conductive plate is formed across the top layer stack. A semi-insulating region is formed in the top layer stack between the conductive plate and the bottom layer stack. The conductive plate provides a connection for an AC-only bias-tee electrode. The present invention is especially concerned with the case where the top and bottom layer stacks are respectively the top and bottom mirror layer stacks associated with an electrical device that is a laser.

It is another particular object to provide a structure for testing an electrical device contained within a wafer. The electrical device has a top ohmic contact on a top layer stack and a bottom contact on a bottom layer stack. A capacitor is formed across the top layer stack. An AC source is connected across the top ohmic contact and the capacitor. A DC source is connected across the top ohmic contact and the bottom contact. The electrical device is capable of producing an output having characteristics responsive to the AC and DC sources. A means is provided for measuring the output characteristics.

It is still another particular object to provide a method comprising the steps of: providing a wafer containing an array of electrical devices, in which each of the electrical devices has a top mirror layer stack forming a first electrode, a bottom mirror layer stack forming a second electrode; electrically connecting a first electrical device contact to the first electrode; electrically connecting a second electrical device contact to the second electrode; forming a conductive plate across the top mirror layer stack which forms a third electrical device contact; implanting a semi-insulating region residing in the top mirror layer stack between the conductive plate and the bottom layer stack. A variation of the method includes a step for reducing the height of part of the top mirror layer stack to bring the conductive plate in closer proximity to the lower mirror layer stack.

BRIEF DESCRIPTION OF THE DRAWINGS

These and other objects, features, and advantages of the present invention will become apparent upon further consideration of the following detailed description of the invention when read in conjunction with the drawing figures, in which.

DESCRIPTION OF THE INVENTION

The present invention is a method to minimize the signal path length for testing an electrical device contained within a wafer to enable testing the device's electrical performance at ultra-high frequencies, and also of an apparatus implementing the method. The invention is particularly directed where the electrical device is a laser, and more particularly directed to wafer testing of a vertical cavity surface emitting laser. The term electrical device as used herein includes devices having only electrical inputs and/or outputs, devices having only optical inputs and/or outputs, and devices having electro-optical inputs and/or outputs. Thus, although the description is directed to VCSELs, the invention is not so limited. The inventive concept is meant to be used with any electrical device.

One way to achieve high frequency testing of electrical devices on a wafer is to minimize the AC test path length by providing contacts with the electrical device on the wafer's top side. A way to do this is to etch a MESA around the electrical device and to add substrate contacts. This is generally undesirable in that the MESA requires additional manufacturing steps adding cost to the manufacturing process. The present invention provides a method to shorten the AC test path length for testing electrical devices and particularly for testing VCSELS, desirably without the necessity of adding steps to the manufacturing process.

Figure 1:
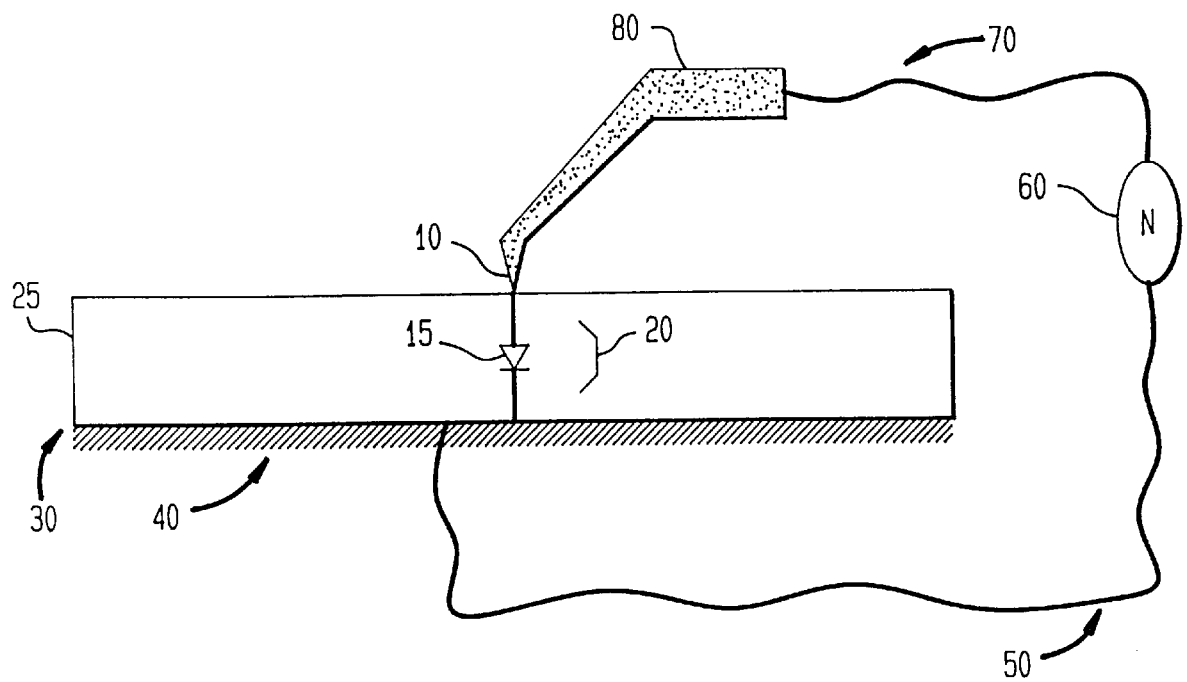
FIG. 1 shows a current loop path of a probe tester.
Figure 2:
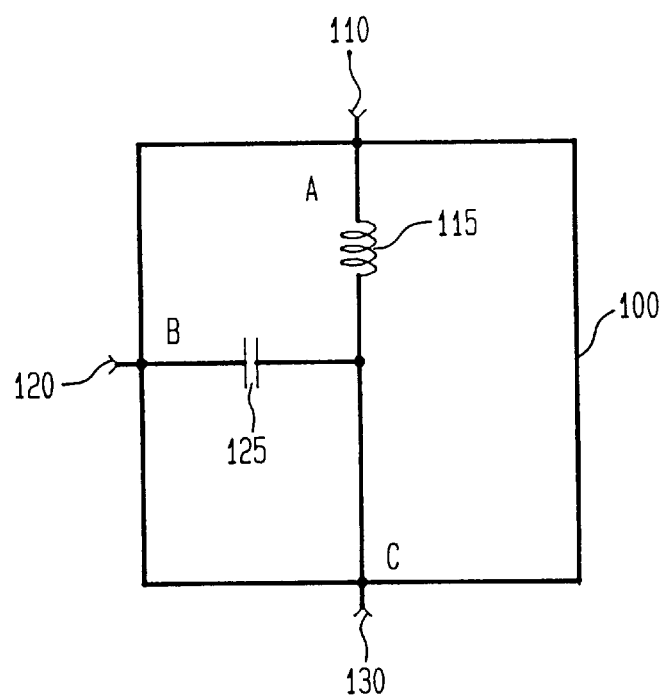
FIG. 2 shows a block diagram of a bias-tee.

The present inventive method provides a laser on a VCSEL wafer the characteristics of a microwave bias-tee device. A bias-tee is a common microwave testing and connecting device. Generally, one port of a bias-tee passes only DC signals, a second port passes only AC signals and a third port passes both AC and DC signals. A block diagram of a microwave bias-tee 100 is shown in FIG. 2. It shows an inductor 115 input, Port A 110, a capacitor 125 input, Port B 120, and a direct input, Port C 130. Substantially, Port A 110 passes only DC signals (DC-only), Port B 120 passes only AC signals (AC-only), and Port C 130 passes both AC and DC signals (AC/DC).

Figure 3:
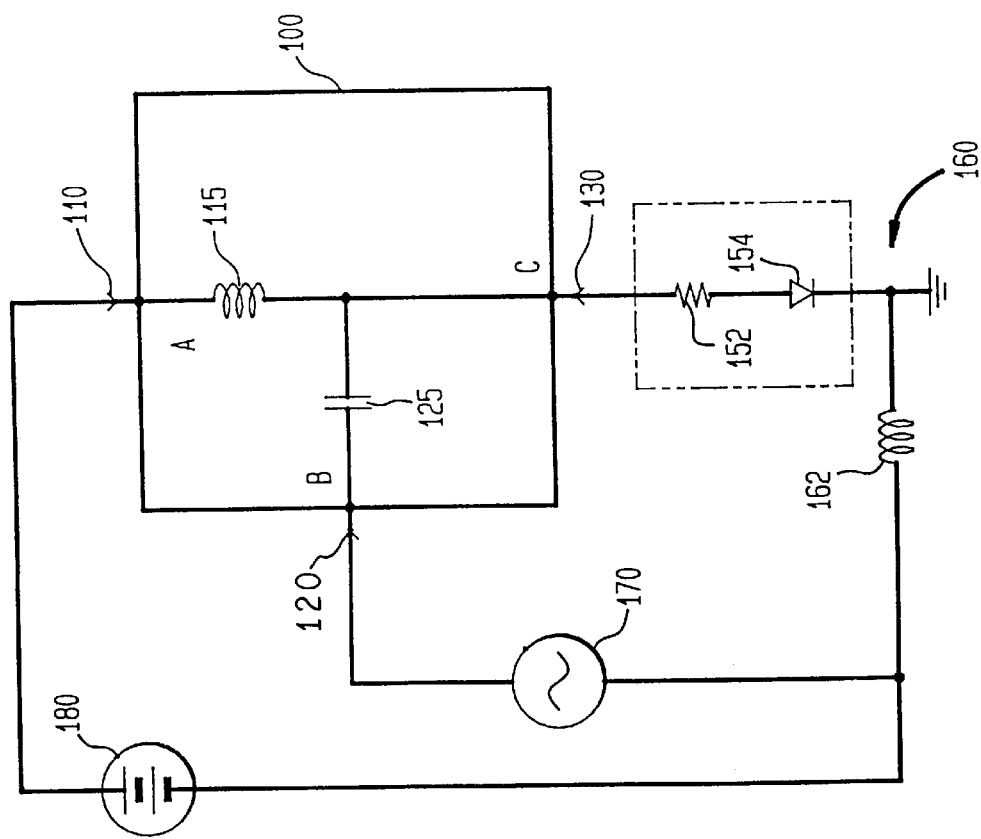
FIG. 3 shows a typical laser test circuit using an external bias-tee.

A heretofore typical laser test circuit using an external bias-tee is shown in FIG. 3. It shows a laser 150 represented by a diode 152 and a series resistor 154. The diode's cathode is connected to a common ground contact 160. Usually the common ground is a chuck, wafer holder or the package case. The diode's anode is connected to the C port 130 of the external bias-tee. An AC test signal source 170 is connected to the bias-tee's B port 120 and a DC bias source 180 is connected to the bias-tee's A port 110. An inductor 162 is shown between the common ground 160 and the AC 170 and DC 180 signal sources. The inductor 162 represents the inductance of the long interconnecting wires. With this circuit arrangement, the highest frequencies that can be used for diode testing are limited by the long path length problem described above.

The present invention modifies the wafer manufacturing process such as to form within the wafer a bias-tee device inherent to a laser diode environment. This results in a shortened AC testing path that enables ultra-high frequency testing of the laser. It is preferable that the bias-tee is formed without adding any steps to the wafer manufacturing process.

Figure 4:
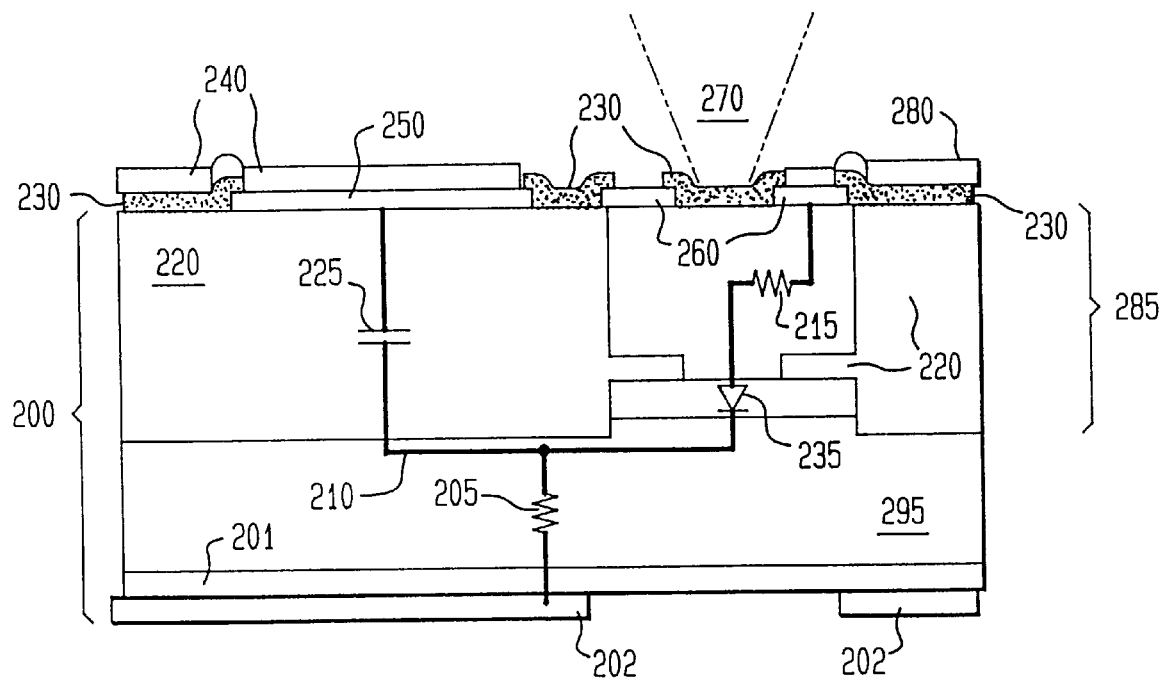
FIG. 4 shows an edge view representation of a laser on a wafer with an internal bias-tee in accordance with the present invention.

The following first describes the present inventive device and concept. Methods for producing the apparatus are described subsequently. FIG. 4 shows a representation of the edge view of a VCSEL laser 200 in a wafer. It also shows a bias-tee superimposed schematically on the laser environs in accordance with the invention. In correspondence with the invention, the bias-tee is formed by defining and employing a combination of inherent wafer elements having particular useful intrinsic properties and an added conductive plate. In totality the combination of elements forms the desired three bias-tee type ports, namely, DC-only, AC-only and AC/DC. Electrical contacts are desirably placed at the defined elements to provide accessibility.

One bias-tee port results from the realization that a bottom-side contact 202 at the substrate 201, shown in FIG. 4, may be used to act as the DC-only bias-tee port. This is because of an inherent bottom-side parasitic resistance that exists between the equivalent bias-tee junction point 210 and the substrate 201 and leads connecting the bottom-side contact 202 to the testing instrumentation which have relatively high inductance. This inductance essentially presents an open circuit to high frequencies. The bottom-side parasitic resistance may be represented by a bottom-side resistor 205 between the junction point 210 and the substrate 201.

A second bias-tee port results by employing a conductive annular ring 260, also shown in FIG. 4, which surrounds the laser's light emitting window 270. The ring 260 forms an electrical contact point for the AC/DC bias-tee port. The ring 260 makes electrical connection with the laser through an inherent parasitic topside resistor 215 existing between the laser diode's anode and the ring 260. A top-side contact 280 may be connected to the annular ring 260 to make the AC/DC bias-tee port accessible for testing.

A third bias-tee port results by designing a capacitor 225 in to the wafer between the junction point 210 and a top surface conductive plate 250. The plate may be formed by modifying the processing mask of one or more top wafer layers, desirably the ohmic contact mask layer 260, as described below. An interconnect metallization contact 240 is connected to the added conducting plate 250. The capacitors 225 capacitance is a result of making the added plate to have a large surface area and to have an insulating region 220 beneath it. The insulating region 220 is a result of ion implantation in the wafers top mirror layers 285. This causes DC currents to be confined to the regions that are not implanted. The implanted region is desirably made to extend down from the top surface conducting plate 250 through the active region 260 to the bottom mirror layers 295. The capacitance is developed from the characteristics of a parallel plate capacitor formed in the wafer. The insulating region 220 presents a high DC impedance that is essentially an open circuit to DC signals. Thus the capacitor contact 240 serves as the AC only bias-tee port.

Figure 5:
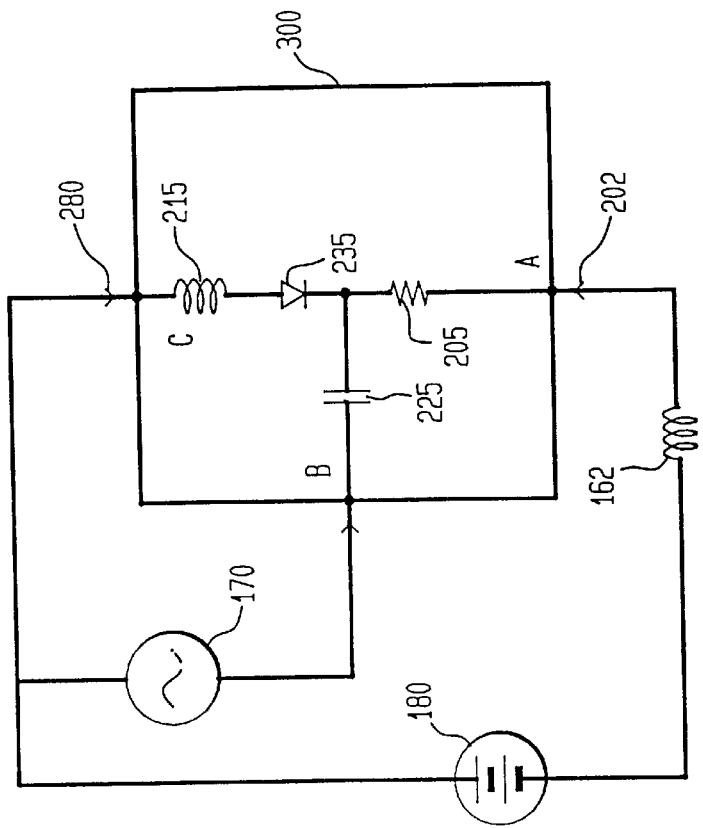
FIG. 5 shows a laser test circuit using an internal bias-tee in accordance with the present invention.

The laser test circuit with internal bias-tee has the form shown schematically in FIG. 5. FIG. 5 uses element designations that correspond with those used in FIGS. 3 and 4, to illustrate the correspondence between the internal bias-tee connection arrangement's and the external bias-tee test circuit shown in FIG. 3. FIG. 5 shows a VCSEL with an internal bias-tee 300 connected to AC and DC test signal sources. The AC signal source 170 is connected directly across the internal bias-tee's AC only port 240 and the internal bias-tee's AC/DC port 280. The DC source 180 is connected across the internal bias-tee's DC-only port, bottom-side contact 202, and the internal bias-tee's AC/DC port 280. Inductor 162 is shown between the bottom-side contact 202 and the DC 180 signal source. The inductor 162 represents the inductance of the long interconnecting wires. With this circuit arrangement, high frequencies may be used for laser testing between the AC only port 240 and the AC/DC port 280.

A preferred method for implementing the invention is to incorporate the bias-tee into the steps of making a VCSEL wafer as follows. An array of VCSEL diodes is integrated on a blank semiconductor wafer, preferably GaAs. Each diode is generally formed by having a quantum well placed between a p-type multi-layer distributed Bragg reflector and an n-type multi-layer distributed Bragg reflector. This may be formed by growing a layer structure in a molecular beam epitaxy (MBE) or a metal organic chemical vapor deposition (MOCVD). A first mask for the particular ohmic contact pattern is processed onto the wafer by putting down metal to form the ohmic contact layer according to the first mask pattern. Metal put down is generally by evaporation or sputtering of titanium Ti, platinum Pt and/or gold. A second mask is created for current/gain guiding. The wafer is implanted with ions of helium, hydrogen or preferably oxygen according to the gain guide mask pattern. A third mask is created for the device isolation pattern. The wafer is implanted according to the isolation pattern. An electrical insulation via layer is deposited over the wafer. The implanted isolation and gain guide regions form the semi-insulating region around which the capacitor is formed. A fourth mask is created according to the desired via layer opening. The via layer is etched in accordance with the fourth mask. A fifth mask is created for the interconnect metal layer. An interconnect metal, preferably gold, is deposited on the wafer according to the fifth mask. A backside metal contact layer, usually Au, is then added to the wafers backside.

For illustration purposes, the steps of VCSEL wafer formation with and without the present invention is now described. FIG. 6 shows the steps of VCSEL wafer formation without the capacitor of the present invention. FIG. 6(*a*) shows the water after epitaxial growth. It shows a diode 235 in an active region 290 which is between the top mirror layer 285 and the bottom mirror layer 295. In the case shown, the diode's cathode is connected to the inherent parasitic topside resistor 215. The anode is connected to the inherent parasitic bottom-side resistor 205. FIG. 6(*b*) shows the formation of the top ohmic contact 245. The top ohmic contact 245 usually takes the form of an annular ring 260 surrounding the diode light emitting window 270 shown in FIG. 6(*c*). FIG. 6(*c*) shows the wafer after oxide deposition and formation of the vias in the oxide layer 230. FIG. 6(*d*) shows the wafer following the final steps of addition of the top interconnecting layer 280 and bottom-side contact 202.

FIG. 7 shows the same steps of FIG. 6 modified for wafer formation to include the capacitor of the present invention. For description and comparison purposes, FIG. 7(*a*) shows the identical starting point of a wafer after epitaxial growth. FIG. 7(*b*) shows the formation of the top ohmic contact 245 that now includes the capacitor plate 250. FIG. 7(*c*) shows the wafer after oxide deposition and formation of the vias in the oxide layer 230. FIG. 7(*d*) shows the wafer following the steps of addition of the top interconnecting layer 280 and the bottom-side contact 202. It is noted that with this implementation, no added processing step is needed to implement the formation of the capacitor plate 250 of the present invention. This implementation is one way to form the invention shown in FIG. 4.

Figure 8:
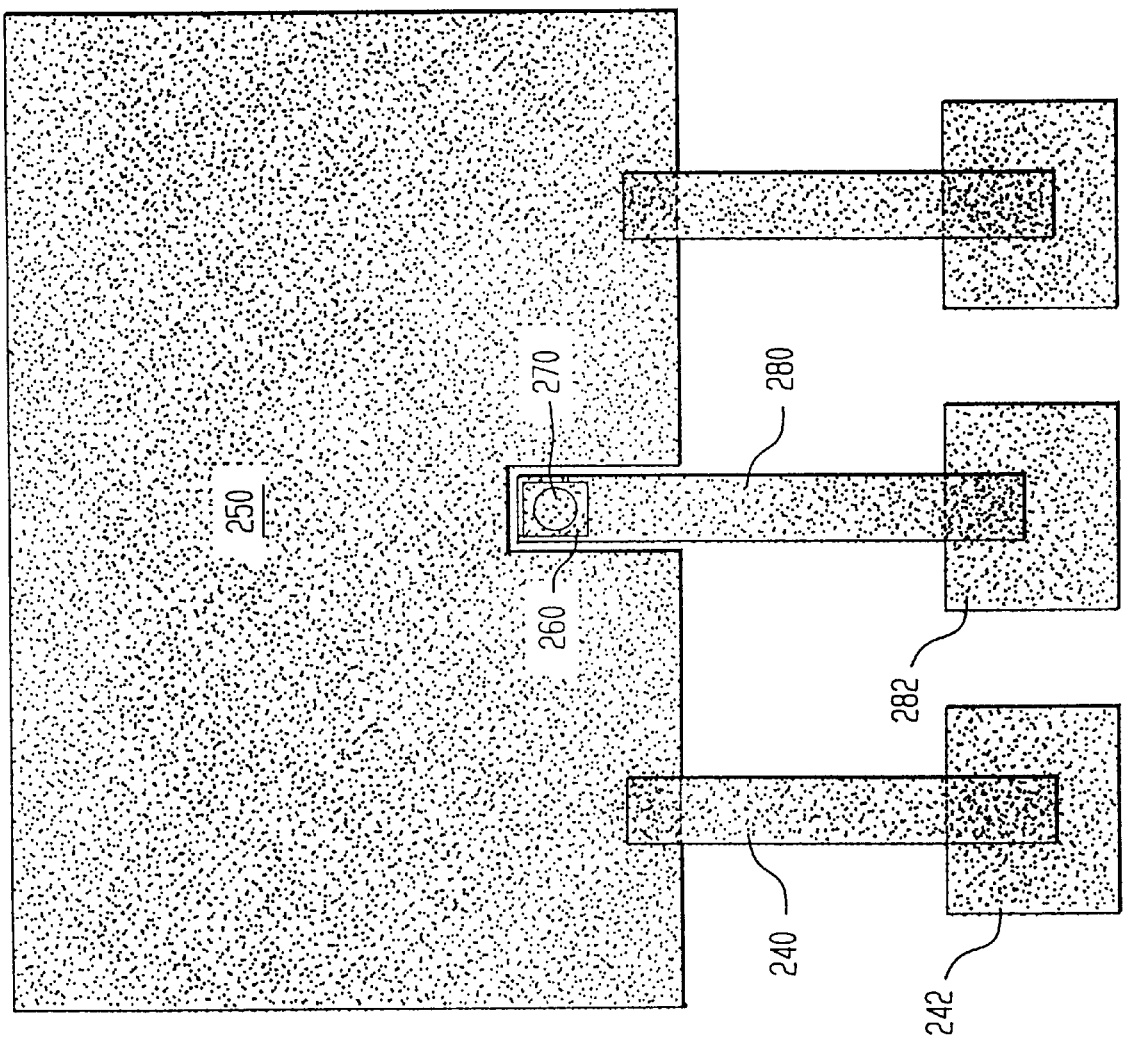
FIG. 8 shows a top view of a wafer in accordance with the present invention.

According to the present invention, the ohmic contact layer is formed to include the conductive capacitor plate 250, preferably in the form shown in FIG. 8. FIG. 8 shows a top view of the wafer. It shows the plate 250 forming the capacitor to have a very large outer contact surface area. The active VCSEL is in the center and shown through the light emitting window 270. Three contacts are shown in a footprint arrangement compatible with a test system such as the Cascade Microtech (Registered) probe. The center contact is used as the bias-tee AC/DC port 280. It is connected to the annular ring 260 and preferably ends in a bonding pad 282. The two outer contacts 240 are used as the bias-tee AC only port and are commonly connected to the conductive plate 250. The outer contacts 240 preferably end in bonding pads 242. The third DC only bias-tee port is normally connected to the substrate at the bottom of the wafer and is not shown in FIG. 8.

This type of bias-tee may be implemented for testing an electrical device within a wafer without adding any steps to the wafer manufacturing process. It requires only modification of the process masks. The actual capacitor may be formed using interconnect metal on top of oxide that is itself on top of layers of semi-insulating semiconductor material. The capacitor may also be formed by using ohmic contact metal on top of semi-insulating semiconductor material. It may also be formed with interconnect metal placed directly on semi-insulating semiconductor material.

Figure 9:
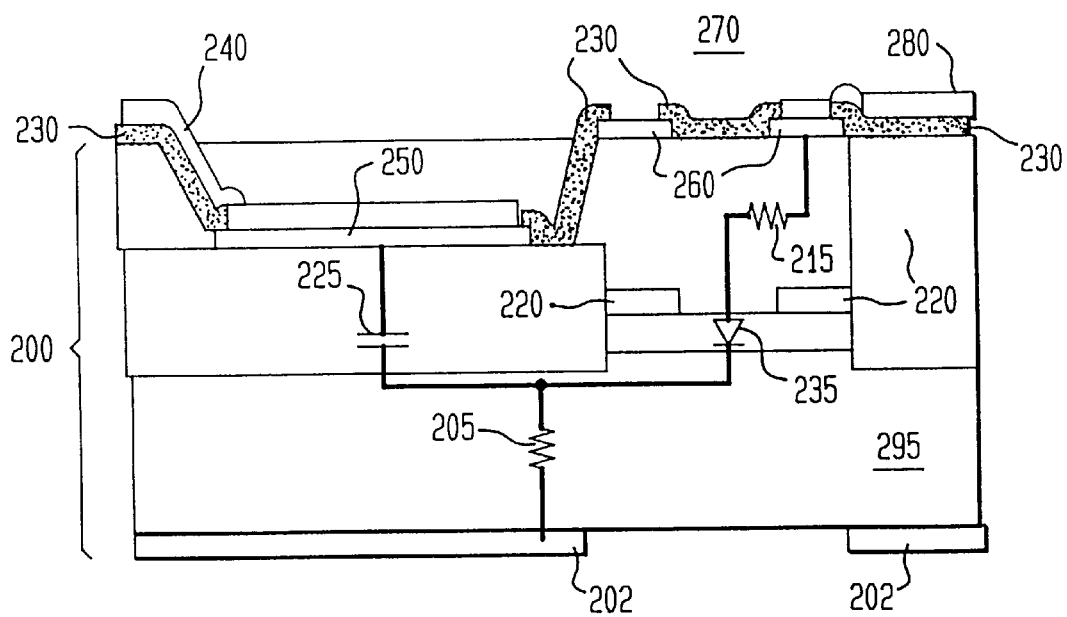
FIG. 9 shows the capacitor plate in accordance with the present invention formed on a depression in the top mirror layer.
Figure 6A:
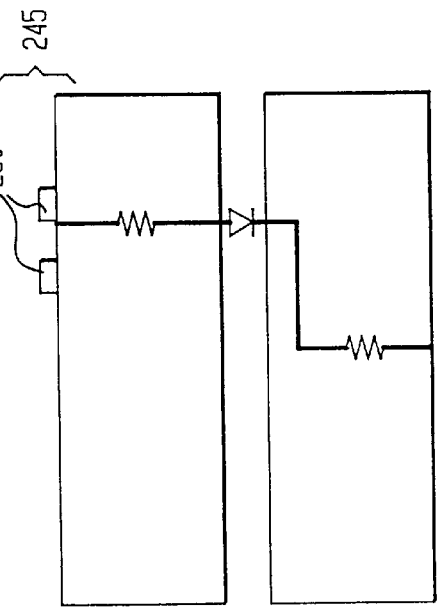
FIGS. 6A–D shows the steps of VCSEL wafer formation without the capacitor of the present invention.
Figure 6B:
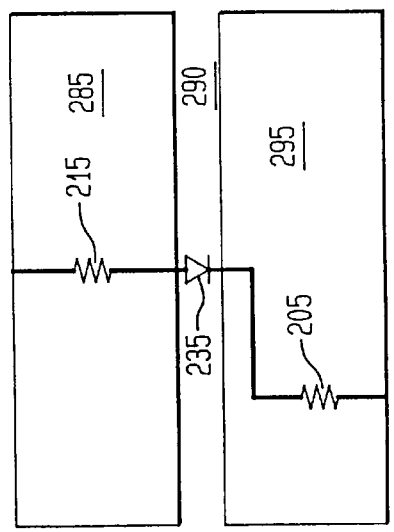
Figure 6C:
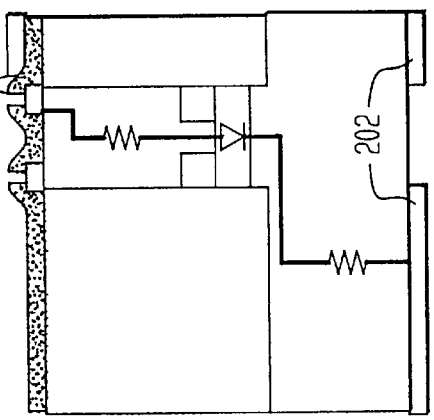
Figure 6D:
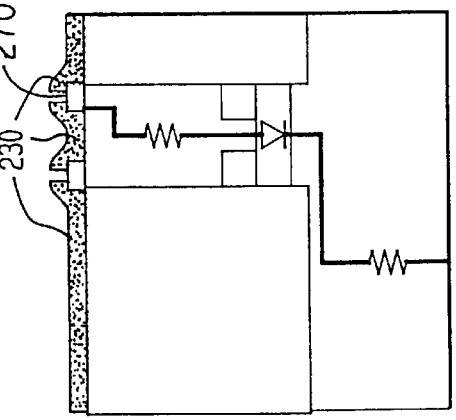
Figure 7A:
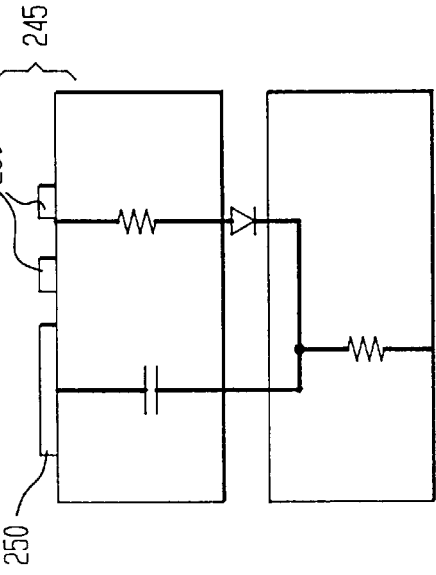
FIGS. 7A–D shows the steps of VCSEL wafer formation with the capacitor of the present invention.
Figure 7B:
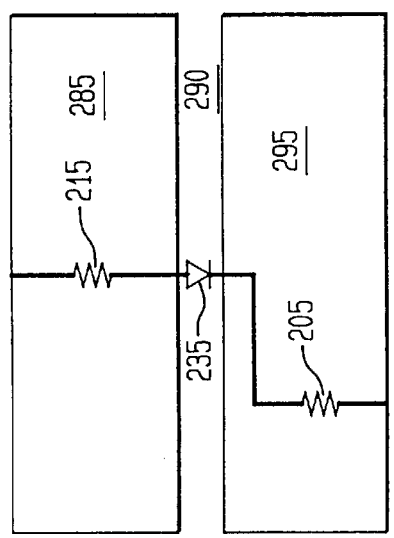
Figure 7C:
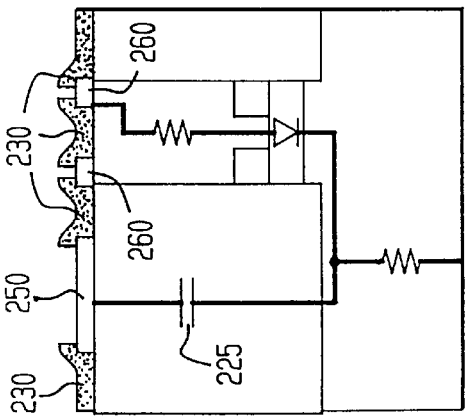
Figure 7D:
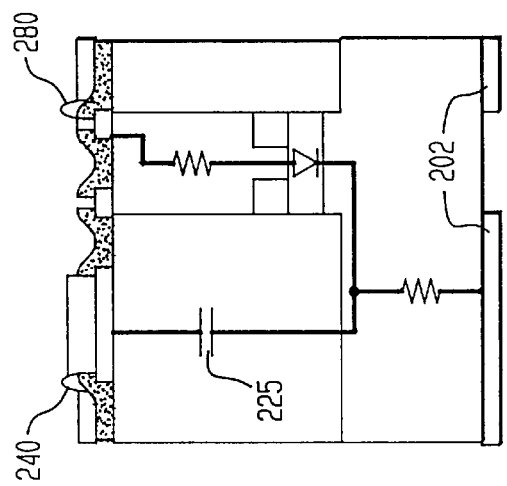

The above process is just one way of implementing an on-wafer bias-tee. Other variations of bias-tee formation using the inventive concept for a variety of electrical devices formed on a wafer are possible. Some implementations require additional manufacturing steps. For example, the capacitor capacitance may be increased by bringing the plate 250 doser to the bottom layer mirrors 295. This would broaden the low side frequency range of the bias-tee's AC only port. This is shown in FIG. 9. FIG. 9 shows the capacitor plate 250 to be formed on a depression in the top mirror layer 285. The depression is the result of an added processing step. It will be apparent to those skilled in the art that modifications to the disclosed embodiments can be effected without departing from the spirit and scope of the present invention.

What is claimed:

1. A method comprising the steps of:
   providing a wafer;
   forming an electrical device within said wafer;
   said electrical device having:
   a top layer forming an upper device surface, said top layer having a first top surface and a second top surface;
   a first electrode making contact with said first top surface;
   a first device contact making electrical contact with said first electrode;
   a bottom layer forming a lower device surface, said bottom layer having a first bottom surface and a second bottom surface, said first bottom surface being attached to said second top surface;
   a second electrode making contact with said first bottom surface;
   a substrate attached to said second bottom surface;
   a second device contact making electrical contact with said substrate;
   attaching a conductive plate to a portion of said first top surface;
   forming a third device contact in electrical contact with said conductive plate; and
   forming a semi-insulated region in said top layer between said portion and said first bottom surface.

2. The method of claim 1 in which said electrical device is capable of producing an output having characteristics and further comprising the steps of:

providing an AC source connected across said first device contact and said third device contact;

providing a DC source connected across said first device contact and said second device contact;

providing means for measuring said characteristics responsive to said AC and said DC sources wherein said means for measuring makes electrical contact with at least one of said device contacts.

3. A method as in claim 1 in which said electrical device is a vertical cavity surface emitting laser.

4. A method as in claim 1 wherein:

said first device contact forms the AC/DC port of a bias-tee;

said second device contact forms the DC-only port of said bias-tee;

said third device contact forms the AC-only port of said bias-tee.

* * * * *